(12) United States Patent
Kadowaki et al.

(10) Patent No.: US 9,287,366 B2
(45) Date of Patent: Mar. 15, 2016

(54) III NITRIDE SEMICONDUCTOR DEVICE AND METHOD OF PRODUCING THE SAME

(71) Applicant: DOWA ELECTRONICS MATERIALS CO., LTD., Tokyo (JP)

(72) Inventors: Yoshitaka Kadowaki, Tokyo (JP); Tatsunori Toyota, Tokyo (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

(21) Appl. No.: 14/369,584

(22) PCT Filed: Dec. 12, 2012

(86) PCT No.: PCT/JP2012/082855
§ 371 (c)(1),
(2) Date: Jun. 27, 2014

(87) PCT Pub. No.: WO2013/099716
PCT Pub. Date: Jul. 4, 2013

(65) Prior Publication Data
US 2015/0069583 A1 Mar. 12, 2015

(30) Foreign Application Priority Data

Dec. 28, 2011 (JP) .................................. 2011-288920

(51) Int. Cl.
*H01L 29/20* (2006.01)
*H01L 33/20* (2010.01)
(Continued)

(52) U.S. Cl.
CPC ........ *H01L 29/2003* (2013.01); *H01L 21/0254* (2013.01); *H01L 21/28* (2013.01);
(Continued)

(58) Field of Classification Search
CPC ................ H01L 33/0079; H01L 2924/12041; H01L 33/22; H01L 33/20; H01L 21/02664; H01L 29/2003; H01L 21/02505; H01L 33/0095; H01L 33/12; H01L 21/6835; H01L 2924/1032; H01L 21/30608; H01L 21/30617; H01L 21/0254; H01L 21/28; H01L 21/30621; H01L 29/045; H01L 29/0657; H01L 29/452; H01L 33/32; H01L 33/40

See application file for complete search history.

(56) References Cited

U.S. PATENT DOCUMENTS

2001/0048113 A1* 12/2001 Kim ........................ H01L 33/20
257/98
2006/0157717 A1* 7/2006 Nagai ................... H01L 33/025
257/81

(Continued)

FOREIGN PATENT DOCUMENTS

EP 1672704 A2 6/2006
EP 2234182 A1 9/2010
(Continued)

OTHER PUBLICATIONS

Gao and etc., "Optimization of AlGaN/GaN current aperture vertical electron transistor (CAVET) fabricated by photoelectrochemical wet etching", J. Appl. Phys., vol. 96, No. 11, 1 Dec. 2004.*

(Continued)

*Primary Examiner* — Yasser A Abdelaziez
*Assistant Examiner* — Farun Lu
(74) *Attorney, Agent, or Firm* — Oliff PLC

(57) ABSTRACT

Provided are a III nitride semiconductor device which can be operated at a lower voltage can be provided, in which device a good ohmic contact is achieved between the (000-1) plane side of the III nitride semiconductor layer and the electrode and a method of producing the III nitride semiconductor device. A III nitride semiconductor device of the present invention includes a plurality of protrusions rounded like domes in a predetermined region on the (000-1) plane side of the III nitride semiconductor layer; and an electrode on the upper surface of the predetermined region.

15 Claims, 11 Drawing Sheets

(51) Int. Cl.
  *H01L 21/02*    (2006.01)
  *H01L 21/28*    (2006.01)
  *H01L 21/306*   (2006.01)
  *H01L 29/04*    (2006.01)
  *H01L 29/06*    (2006.01)
  *H01L 29/45*    (2006.01)
  *H01L 33/32*    (2010.01)
  *H01L 33/40*    (2010.01)

(52) U.S. Cl.
  CPC .... *H01L21/30617* (2013.01); *H01L 21/30621* (2013.01); *H01L 29/045* (2013.01); *H01L 29/0657* (2013.01); *H01L 29/452* (2013.01); *H01L 33/20* (2013.01); *H01L 33/32* (2013.01); *H01L 33/40* (2013.01)

(56) References Cited

U.S. PATENT DOCUMENTS

| | | |
|---|---|---|
| 2006/0273334 A1 | 12/2006 | Nagai et al. |
| 2007/0018187 A1 | 1/2007 | Lee et al. |
| 2007/0224714 A1 | 9/2007 | Ikeda et al. |
| 2010/0072501 A1 | 3/2010 | Wakai et al. |
| 2012/0119243 A1 | 5/2012 | Kim et al. |
| 2012/0214267 A1* | 8/2012 | Wang ............... H01L 33/22 438/29 |

FOREIGN PATENT DOCUMENTS

| | | |
|---|---|---|
| JP | 2004071657 A * | 3/2004 |
| JP | A-2004-71657 | 3/2004 |
| JP | A-2006-179511 | 7/2006 |
| JP | A-2006-324324 | 11/2006 |
| JP | A-2007-535152 | 11/2007 |
| JP | A-2008-130799 | 6/2008 |
| JP | A-2010-74008 | 4/2010 |
| JP | A-2010-147056 | 7/2010 |
| JP | A-2010-205988 | 9/2010 |
| JP | A-2010-212719 | 9/2010 |
| JP | A-2011-82587 | 4/2011 |
| JP | A-2011-243956 | 12/2011 |
| TW | 200725948 A | 9/1995 |
| TW | I309893 B | 5/2009 |
| WO | WO 2012058535 * | 5/2012 |

OTHER PUBLICATIONS

Ha and etc., "The Fabrication of Vertical Light-Emitting Diodes Using Chemical Lift-Off Process", IEEE Photonics Technology Letters, vol. 20, No. 3, Feb. 1, 2008.*
Gao and etc., "Optimization of AlGaN/GaN current aperture vertical electron transistor (CAVET) fabricated by photoelectrochemical wet etching", J. Appl. Phys., vol. 96, No. 11, Dec. 1, 2004.*
Lu and etc. "Blue LED growth from 2 inch to 8 inch", Sci China Tech Sci Jan. 2011 vol. 54 No. 1.*
"Optimization of AlGaN/GaN current aperture vertical electron transistor (CAVET) fabricated by photoelectrochemical wet etching" by Gao, J. Appl. Phys., vol. 96, No. 11, Dec. 1, 2004.*
Office Action issued in Japanese Patent Application No. 2011-288920 dated Jan. 22, 2013 (with partial translation).
Office Action issued in Japanese Patent Application No. 2011-288920 dated Mar. 26, 2013 (with partial translation).
Office Action Issued in Japanese Patent Application No. 2013-049538 dated Dec. 24, 2013 (with partial translation).
International Search Report issued in International Application No. PCT/JP2012/082855 mailed Apr. 16, 2013.
Dec. 27, 2014 Office Action issued in Taiwanese Patent Application No. 101147404.
Apr. 30, 2015 Search Report issued in European Application No. 12861839.4.
Aug. 27, 2015 Office Action issued in Taiwanese Application No. 101147404.

* cited by examiner

III NITRIDE SEMICONDUCTOR DEVICE AND METHOD OF PRODUCING THE SAME

TECHNICAL FIELD

The present invention relates to a III nitride semiconductor device and a method of producing the same.

BACKGROUND ART

III nitride semiconductor devices such as field effect transistors (FETs), light emitting diodes (LEDs), which each have an element part formed from a Group III nitride semiconductor using Al, Ga, In, or the like as a Group III element and using N as a Group V element, are studied.

A III nitride semiconductor such as GaN or AlGaN typically has a hexagonal wurtzite crystal structure. In cases where a III nitride semiconductor such as GaN is epitaxially grown on a substrate of a different type, such as sapphire, typically, a layer is grown in the c axis direction, and the surface of the layer to be grown is the (0001) plane, which is called the Ga-face, whereas the surface on the opposite side is the (000-1) plane (the side in contact with the substrate). Further, for a III nitride semiconductor substrate such as a GaN substrate, typically, a surface on one side is the (0001) plane, whereas the surface on the opposite side is the (000-1) plane.

Here, JP 2004-071657 A (PTL 1) describes a technique of forming an active element portion composed of a III nitride semiconductor layer on the (0001) plane of an n-type GaN substrate; forming, in a III nitride semiconductor device provided with a p electrode on the active element and an n electrode on the (000-1) plane side of the n-type GaN substrate, pyramidal projections having a certain facet on the surface by wet etching or the like on the (000-1) plane side of the n-type GaN substrate; and forming an n electrode of Ti/Al or Ti/Au so as to cover the protrusions, thus obtaining a good ohmic contact.

GaN substrates and SiC substrates are still expensive, and conductive single crystal substrates having a large diameter are not available at low cost. Thus, a semiconductor is commonly grown on a sapphire substrate.

However, a sapphire substrate is electrically insulating; accordingly, electric current does not flow in the substrate. Therefore, in conventional devices, a semiconductor laminate formed by sequentially growing an n-type III nitride semiconductor layer, an active layer, and a p-type III nitride semiconductor layer on a sapphire substrate is partially removed to expose the n-type III nitride semiconductor layer. Further, a lateral structure has been employed in which an electric current is flown in a lateral direction by providing an n-side electrode and a p-side electrode on the exposed n-type III nitride semiconductor layer and the p-type III nitride semiconductor layer, respectively.

In contrast, in recent years, techniques of obtaining devices having a vertical structure as follows are studied. First, a buffer layer is formed on a sapphire substrate, which buffer layer is to be removed by, for example, laser irradiation, etching, or the like, and a semiconductor laminate is then formed, which laminate includes an n-type III nitride semiconductor layer, an active layer, and a p-type III nitride semiconductor layer. Next, after forming a conductive support on the semiconductor laminate, which support supports the semiconductor laminate, the buffer layer is decomposed by laser irradiation or selectively dissolved by etching, thereby separating (lifting off) the sapphire substrate. The support and the semiconductor laminate are sandwiched between a pair of electrodes to form a device. Note that a "buffer layer" here is a buffer layer for epitaxial growth of a semiconductor laminate, which buffer layer also serves as a lift-off layer for separating the semiconductor laminate from a sapphire substrate. The methods of fabricating III nitride semiconductor devices as described above are referred to as laser lift-off method and chemical lift-off method.

CITATION LIST

Patent Literature

PTL 1: JP 2004-071657 A

SUMMARY OF INVENTION

Technical Problem

In the above device having a lateral structure, both the n-side electrode and the p-side electrode are formed on the (0001) plane side of the n-type III nitride semiconductor layer and the same side of the p-type III nitride semiconductor layer, respectively. On the other hand, in the device having a vertical structure, the p-side electrode is formed on the (0001) plane side of the p-type III nitride semiconductor layer, whereas the n-side electrode is formed on the (000-1) plane side of the n-type III nitride semiconductor layer.

According to the studies of the inventors of the present invention, it was found that not only in the case of forming a III nitride semiconductor substrate as in PTL 1, but also in the case of forming an electrode on the III nitride semiconductor layer, different ohmic contact properties are obtained depending on whether it is formed on the (0001) plane side or on the (000-1) plane side. Thus, in the case of the above vertical structure, a sufficient ohmic contact cannot be obtained between the n-type III nitride semiconductor layer and the n-side electrode when the ohmic contact is formed on the (000-1) plane side, which would result in the increased resistance, that is, the increased voltage of the n-side electrode.

The present inventors made further studies to find that when the (000-1) plane of an n-type III nitride semiconductor layer exposed after the removal of a lift-off layer is subjected to wet etching to form a plurality of pyramidal projections having a certain facet on the surface and an n-side electrode was formed thereon, a sufficient ohmic contact is not obtained between the n-type III nitride semiconductor layer and the n-side electrode. On the contrary, in such a case, it was found that the resistance became higher than in cases where the protrusions are not formed.

In view of the above problems, it is an object of the present invention is to provide a III nitride semiconductor device which can be operated at a lower voltage, in which device an electrode is formed on the (000-1) plane side of a III nitride semiconductor layer and a good ohmic contact is achieved between the (000-1) plane side of the III nitride semiconductor layer and the electrode and to provide a method of producing the same.

Solution to Problem

In order to achieve the above object, the present invention primarily includes the following components.
(1) A III nitride semiconductor device having a III nitride semiconductor layer, comprising: a plurality of protrusions rounded like domes in a predetermined region on the (000-1) side of the III nitride semiconductor layer; and an electrode on the upper surface of the predetermined region.

(2) The III nitride semiconductor device according to (1) above, wherein the bottom portions of valleys formed between the adjacent protrusions has a steep angle.
(3) The III nitride semiconductor device according to (1) or (2) above, wherein the surface of each of the protrusions is a random surface in which a facet cannot be defined.
(4) A III nitride semiconductor device comprising: a support; and a first conductivity-type III nitride semiconductor layer, an active layer, and a second conductivity-type III nitride semiconductor layer sequentially placed on the support, wherein the side of the second conductivity-type III nitride semiconductor layer opposite to the support is the (000-1) side, and the III nitride semiconductor device has a plurality of protrusions rounded like domes in a predetermined region on the (000-1) side of the second conductivity-type III nitride semiconductor layer and has an electrode on the upper surface of the predetermined region.
(5) The III nitride semiconductor device according to (4) above, wherein the second conductivity type is n type.
(6) The III nitride semiconductor device according to (4) or (5) above, wherein the electrode is a Ti/Al electrode.
(7) A method of producing a III nitride semiconductor device having a III nitride semiconductor layer, comprising the steps of: performing anisotropic etching on a predetermined region on the (000-1) side of the III nitride semiconductor layer to form a plurality of pyramidal projections; performing isotropic etching on the predetermined region to change the projections into protrusions rounded like domes; and forming an electrode on the upper surface of the predetermined region having the protrusions.
(8) The method of producing a III nitride semiconductor device, according to (7) above, wherein the anisotropic etching is wet etching in which the surface of each of the projections is a facet other than the (000-1) plane.
(9) The method of producing a III nitride semiconductor device, according to (8) above, wherein the facet is one of the (10-1-1) plane, the (10-1-2) plane, and the (10-1-3) plane.
(10) The method of producing a III nitride semiconductor device, according to (8) or (9) above, wherein an alkaline solution is used in the anisotropic etching.
(11) The method of producing a III nitride semiconductor device, according to any one of (8) to (10) above, wherein the isotropic etching is dry etching in which the surface of each of the protrusions is a random surface where a facet cannot be defined.
(12) The method of producing a III nitride semiconductor device, according to any one of (7) to (11) above, wherein the step of forming the electrode comprises: forming a protective film on the upper surface of the predetermined region; applying resist onto the protective film and removing the resist of an electrode formation area by photolithography; removing the protective film of the electrode formation area; and forming an electrode in the electrode formation area.
(13) A method of producing a III nitride semiconductor device, comprising the steps of: forming a lift-off layer, a second conductivity-type III nitride semiconductor layer, an active layer, and a first conductivity-type III nitride semiconductor layer in this order on a growth substrate; forming a support on the first conductivity-type III nitride semiconductor layer; removing the lift-off layer, thereby separating the growth substrate from the second conductivity-type III nitride semiconductor layer; performing anisotropic etching on a predetermined region of the exposed second conductivity-type III nitride semiconductor layer on the (000-1) plane side, thereby forming a plurality of pyramidal projections; performing isotropic etching on the predetermined region and changing the projections into a plurality of protrusions rounded like domes; and forming an electrode on the upper surface of the predetermined region having the protrusions.

Advantageous Effect of Invention

For a III nitride semiconductor device of the present invention, a plurality of protrusions rounded like domes are provided in a predetermined region on the (000-1) plane side of a III nitride semiconductor layer, and an electrode is provided on the upper surface of the predetermined region. This results in a good ohmic contact between the (000-1) plane side of the III nitride semiconductor layer and the electrode; thus, a III nitride semiconductor device that can be operated at a lower voltage can be obtained.

Further, in accordance with a method of producing a III nitride semiconductor device of the present invention, a predetermined region on the (000-1) plane side of the III nitride semiconductor layer is subjected to anisotropic etching and subsequent isotropic etching; thus, the above protrusions rounded like domes can be effectively formed. As a result, a good ohmic contact between the (000-1) plane side of the III nitride semiconductor layer and the electrode is achieved, which makes it possible to obtain a III nitride semiconductor device that can be operated at a lower voltage.

BRIEF DESCRIPTION OF DRAWINGS

FIG. 6(A) shows a surface of an n-type III nitride layer taken at an oblique viewing angle prior to the formation of an n-side electrode. FIG. 6(B) shows a cross section in the vicinity of the electrode formation surface, taken after the formation of the n-side electrode.

FIG. 7(A) shows a surface of an n-type III nitride layer taken at an oblique viewing angle prior to the formation of an n-side electrode. FIG. 7(B) shows a cross section in the vicinity of the electrode formation surface, taken after the formation of the n-side electrode.

FIG. 8(A) shows a surface of an n-type III nitride layer taken at an oblique viewing angle prior to the formation of an n-side electrode. FIG. 8(B) shows a cross section in the vicinity of the electrode formation surface, taken after the formation of the n-side electrode.

FIG. 9(A) shows a surface of an n-type III nitride layer taken at an oblique viewing angle prior to the formation of an n-side electrode. FIG. 9(B) shows a cross section in the vicinity of the electrode formation surface, taken after the formation of the n-side electrode.

FIG. 10(A) shows a surface of an n-type III nitride layer taken at an oblique viewing angle prior to the formation of an n-side electrode. FIG. 10(B) shows a cross section in the vicinity of the electrode formation surface, taken after the formation of the n-side electrode.

DESCRIPTION OF EMBODIMENTS

Figure 1:
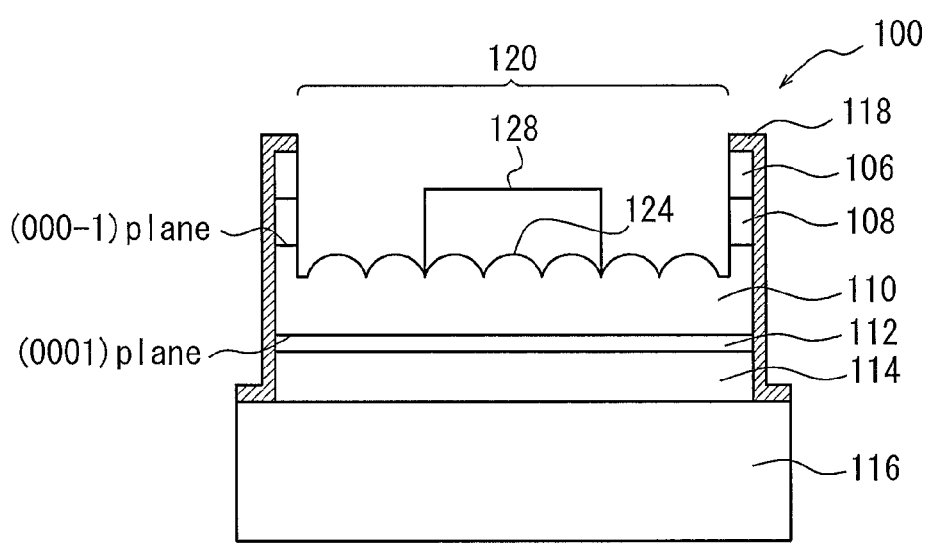
FIG. 1 is a schematic cross-sectional view of a III nitride semiconductor device 100 in accordance with an embodiment of the present invention.

The present invention is described below in more detail, with reference to the accompanying drawings. Note that in the schematic cross-sectional views of the semiconductor devices, layers other than a support are enlarged in the thickness direction for the sake of explanation; accordingly, the ratio of the illustrated layers to the illustrated support does not conform to the actual ratio.

(III Nitride Semiconductor Device)

A III nitride semiconductor device 100 (hereinafter also simply referred to as "device" 100) of an embodiment of the present invention is described with reference to FIG. 1. The device 100 has a support 116; and a p-type III nitride semiconductor layer 114 (hereinafter simply referred to as "p layer"), an active layer 112, and an n-type III nitride semiconductor layer 110 (hereinafter, simply referred to as "n layer") which are sequentially placed on the support 116. An n-side electrode 128 is placed on the n layer 110 and is electrically connected to the n layer. Further, the support 116 is conductive and serves also as a p-side electrode electrically connected to the p layer 114. Note that a superlattice buffer layer 108 and an AlN buffer layer 106 which are placed on the periphery of the n layer 110; and a mask 118 covering the periphery of the semiconductor layers and the edge of a surface of the support 116 are described below.

Here, for a pair of surfaces of the n layer 110, a surface of on the support 116 side is the (0001) plane, whereas the surface on the side opposite to the support 116 is the (000-1) plane. A plurality of protrusions 124 rounded like domes are provided in a predetermined region 120 on the (000-1) plane side of the n layer 110, whereas an n-side electrode 128 is provided on the upper surface of the predetermined region.

Figure 4A:
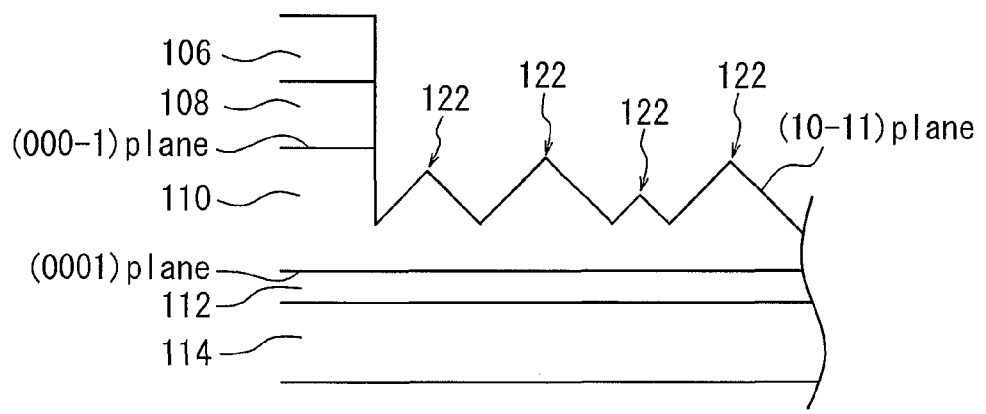
FIGS. 4(A) and 4(B) each schematically show the surface profile of an n-type III nitride layer 110 in a conventional III nitride semiconductor device.

The present inventors found that this structure results in an improved ohmic contact between the n layer 110 and the n-side electrode 128 and allows the device to be operated at a lower voltage than a case shown in FIG. 4(B) described below where the (000-1) plane side of the n layer 110 is flat and the (000-1) plane is exposed or than a case shown in FIG. 4(A) described below where pyramidal projections are on the (000-1) plane side of the n layer 110 and facets other than the (000-1) plane are exposed.

(Method of Producing III Nitride Semiconductor Device)

Figure 2A:
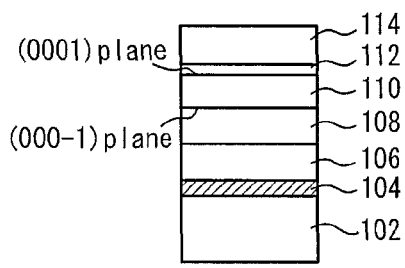
FIGS. 2(A) to 2(G) are schematic cross-sectional views illustrating the steps of a method of producing a III nitride semiconductor device according to an embodiment of the present invention.

A method of producing a III nitride semiconductor device in accordance with an embodiment of the present invention, which makes it possible to preferably produce the above device 100 is described with reference to FIGS. 2(A) to 2(G) and FIGS. 3(A) to 3(C). First, as shown in FIG. 2(A), a lift-off layer 104 is formed on a growth substrate 102; an AlN buffer layer 106 and a superlattice buffer layer 108 are sequentially formed thereon; and an n-type III nitride semiconductor layer 110, an active layer 112, and a p-type III nitride semiconductor layer 114 are formed thereon in this order. The superlattice buffer layer 108 is formed to reduce lattice mismatch with the n layer 110 to be formed thereon and to improve the crystal quality of the n layer 110.

Subsequently, grooves are formed in a grid pattern in the stacked semiconductor layers 106 to 114, in which grooves the growth substrate 102 is exposed at the bottom, thereby forming semiconductor structures isolated from each other. FIG. 2(B) shows only one of the semiconductor structures segmented by the grooves. Subsequently, a support 116 is formed on the p layer 114 as shown in FIG. 2(B). The support 116 supports the stacked semiconductor layers after the separation of the growth substrate 102 described below.

Figure 2D:
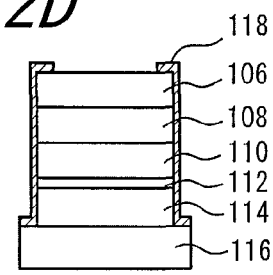
Figure 2B:
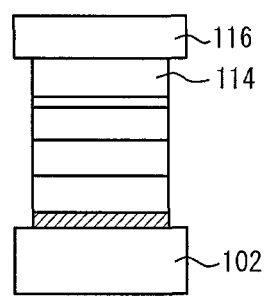
Figure 2E:
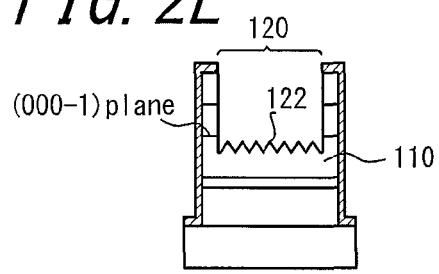
Figure 2C:
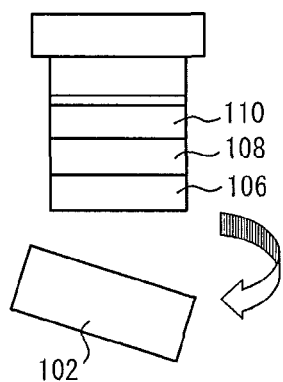

Next, as shown in FIG. 2(C), the lift-off layer 104 is removed by a chemical lift-off process, thereby separating the growth substrate 102 from the n layer 110, the superlattice buffer layer 108, the AlN buffer layer 106, and the like.

Subsequently, as shown in FIG. 2(D), a mask 118 is formed to cover the edge of the surface of the AlN buffer layer 106, the periphery of the semiconductor layers and the edge of the surface of the support 116. The mask 118 is formed from an insulating film of $SiO_2$, SiN, or the like and protects the covered part from anisotropic etching and isotropic etching described below.

Next, as shown in FIG. 2(E), anisotropic etching, for example, wet etching using an alkaline solution such as a 2.38 mass % tetramethylammonium hydroxide (TMAH) solution is performed on the AlN buffer layer 106 of the predetermined region 120 exposed without being covered with the mask 118. As etching proceeds, the AlN buffer layer 106 and the superlattice layer 108 are removed to expose the n layer 110.

At this point, the (000-1) plane side of the layer 110 is exposed. When the III nitride semiconductor is epitaxially grown, as described above, a layer is grown in the c axis direction and the surface of the layer to be grown is the (0001) plane, which is called the Ga-face, whereas the (000-1) plane, which is called the N-face is formed on the opposite side (the side of contact with the support). Accordingly, in the layer formation stage in FIG. 2(A), the face of the n layer 110, which is in contact with the superlattice buffer layer 108 is the (000-1) plane, whereas the face on which the active layer 112 is to be grown is the (0001) plane.

Figure 3A:
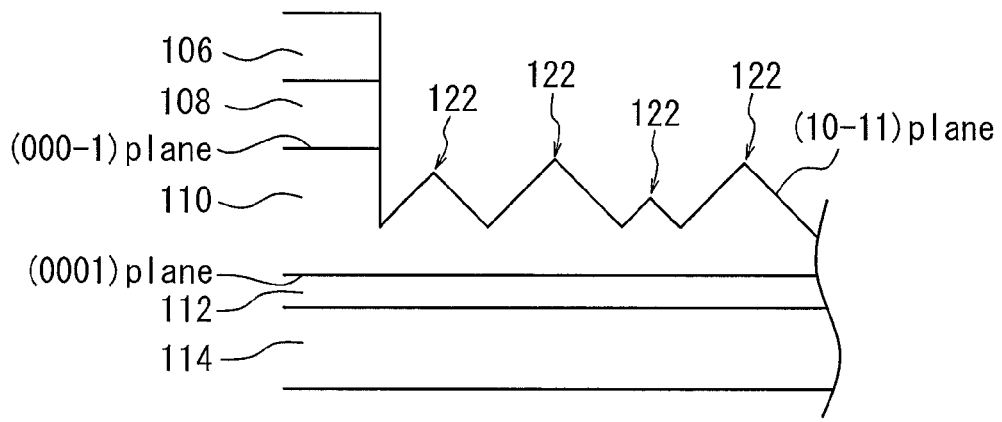
FIGS. 3(A) and 3(B) are cross-sectional views schematically illustrating the surface profile of an n-type III nitride layer 110 in the steps shown in FIGS. 2(E) and 2(F), respectively.

In FIG. 2(E), anisotropic etching is subsequently performed on the predetermined region 120 of the exposed n layer 110 on the (000-1) plane side. Upon the anisotropic etching on the (000-1) plane side of the n layer 110, as also shown in FIG. 3(A), a plurality of pyramidal projections 122 are formed on the surface of the n layer 110. Since the III nitride semiconductor has a hexagonal system, typically, hexagonal pyramidal projections are formed. The anisotropic etching is wet etching in which the surface of each projection 122 is a facet other than the (000-1) plane. It has been reported that in cases where the etchant is an alkaline solution as in this embodiment, the facet to be exposed on the projections 122 is the (10-1-1) plane or another plane equivalent to the foregoing plane.

Figure 2F:
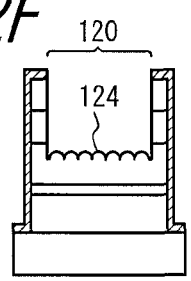
Figure 3B:
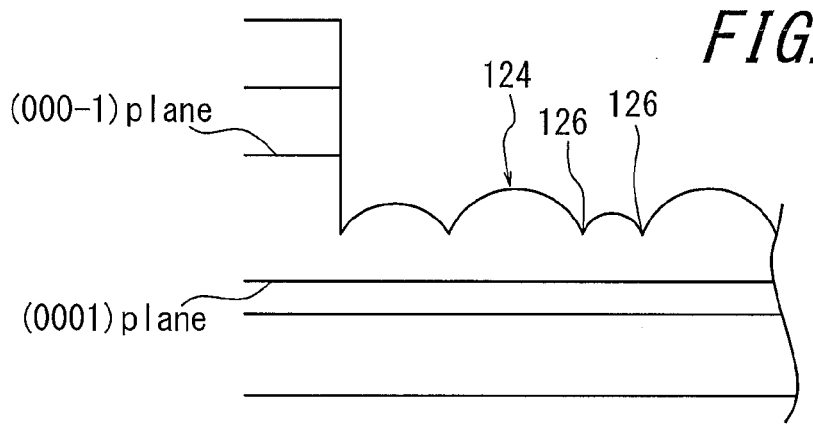

Next, as shown in FIG. 2(F), isotropic etching is performed on the predetermined region 120. Thereupon, as shown in FIG. 3(B), the plurality of projections 122 change into a plurality of protrusions 124 rounded like domes. The isotropic etching is, for example, a dry etching such as reactive ion etching (RIE). As a result of isotropic etching, the surface of each protrusion 124 shown in FIG. 3(B) becomes a random surface where a facet cannot be defined.

Figure 2G:
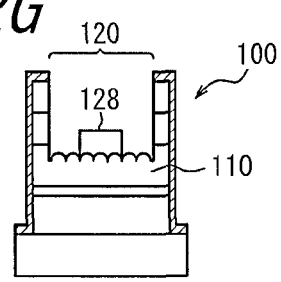

In the state where the n layer 110 has the protrusions 124 in FIG. 3(B) on the (000-1) plane side, the n-side electrode 128 is formed on the upper surface of the predetermined region 120 of the n layer 110 as shown in FIG. 2(G). Through the above steps the device 100 of this embodiment is completed.

Characteristic features of the present invention that are inherent in embodiments of such a device 100 and such a method of producing the same are described with the operation and effect.

A method of producing a III nitride semiconductor device in accordance with the present invention is characterized by including the steps of: performing anisotropic etching on a predetermined region on the (000-1) plane side of a III nitride semiconductor layer, thereby forming a plurality of pyramidal projections; performing isotropic etching on the predetermined region, thereby changing the projections into a plurality of protrusions rounded like domes; and forming an electrode on the upper surface of the predetermined region having the protrusions, as shown in FIGS. 2(E) to 2(G) and FIGS. 3(A) and 3(B). Further, a III nitride semiconductor device of the present invention can be obtained by, for example, the above production method and is characterized by having a plurality of protrusions rounded like domes in a predetermined region on the (000-1) plane side of a III nitride semiconductor layer; and an electrode on the upper surface of the predetermined region.

Figure 4B:
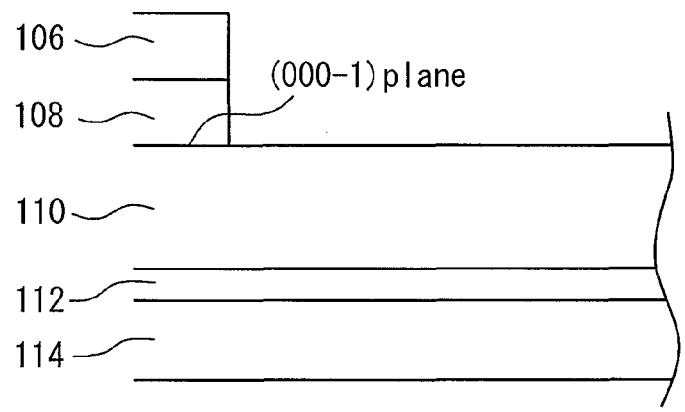

If the step of exposing the surface of the n layer 110 as shown in FIG. 2(E) is performed only by isotropic etching, the surface of the n layer 110 is flat and the (000-1) plane is exposed as shown in FIG. 4(B). Further, if the same step is performed only by anisotropic etching, the surface of the n layer 110 has pyramidal (hexagonal pyramidal) projections 122 as shown in FIG. 4(A). It is reported that the surface of each projection 122 is the (10-1-1) plane or a plane equivalent thereto. According to the studies made by the present inventors, when an n-side electrode is formed on the surface of the n layer 110 of each of the above two types, a sufficient ohmic contact was not obtained in either case. The voltage between two points on the n-side electrode was measured to be high in either case. This means that the voltage at which the device can be operated is also high.

On the other hand, when the n-side electrode is placed on the surface of the n layer 110 having the plurality of protrusions 124 rounded like domes on the (000-1) plane side as in this device 100, a good ohmic contact is obtained and the voltage between two points on the n-side electrodes at is sufficiently lower than in the above two cases. Thereupon, such a surface of the protrusion is effectively formed by performing anisotropic etching and subsequent isotropic etching on a predetermined region on the (000-1) plane side of the III nitride semiconductor layer. With such a device 100 and such a method of producing the same, a good ohmic contact between the (000-1) plane side of the III nitride semiconductor layer and the electrode, which allows the device to be operated at a lower voltage.

Note that the operation of reduction in the voltage between two points on the n-side electrodes with the above characteristic features is not completely elucidated; however, at least the relation between the operation and the area of the contact with the n-side electrodes of the n layer seems to be low. The surface area of the n layer seems not to be greatly different between the case in FIG. 4(A) and the case of the present invention in FIG. 3(B); however, the difference between the potentials of the two points on the n-side electrodes was significantly large.

Further, in this production method, prior to anisotropic etching and subsequent isotropic etching, isotropic etching may be performed for the purpose of completely or partially removing the AlN layer 106 and the superlattice buffer layer 108.

A sapphire substrate or an AlN template substrate in which an AlN film is formed on a sapphire substrate is preferably used as the growth substrate 102. The selection may be made depending on the kind of a lift-off layer to be formed; the composition of Al, Ga, and In of the semiconductor laminate made of a III nitride semiconductor; the quality and cost of LED chips; and the like.

The material of the lift-off layer 104 is not limited in particular as long as it can be dissolved in the etchant, for example, it may be a buffer layer made of a metal other than III metals, such as CrN, or a nitride of such a metal.

The AlN buffer layer 106, the superlattice buffer layer 108, the n layer 110, the active layer 112, and the p layer 114 can be epitaxially grown sequentially on the lift-off layer 104, for example, by MOCVD. The superlattice buffer layer 108 is formed by alternately stacking two types of $Al_xGa_{1-x}N$ ($0 \le x \le 1$) layers having a different Al composition x. The n layer 110 and the p layer 114 are made of a given III nitride semiconductor such as an AlInGaN-based semiconductor, and are formed from cladding layers having an active layer therebetween and respective contact layers in contact with the n-side electrode and the p-side electrode. The active layer 112 may be a light emitting layer having a multiple quantum well (MQW) structure formed from a III nitride semiconductor. In this case, the device 100 is an LED. Typically, the AlN buffer layer 106, the superlattice buffer layer 108, the n layer 110, the active layer 112, and the p layer 114 have film thicknesses of approximately 0.6 μm to 2 μm, 0.6 μm to 3 μm, 1 μm to 4 μm, 1 nm to 100 nm, and 0.1 μm to 1 μm, respectively.

The support 116 may be a conductive silicon substrate, a CuW alloy substrate, or a Mo substrate, formed by a bonding method or by wet or dry plating. For example, Cu or Au electroplating is employed; Cu, Ni, Au, or the like can be used as the connection layer. The support 116 can also serve as the p-side electrode.

Etchants that can be used for the chemical lift-off process are not limited in particular. When the lift-off layer is CrN, an etchant having selectivity to CrN, such as a diammonium cerium(IV) nitrate solution or a potassium permanganate-based solution can be used. In cases where the lift-off layer is ScN, Hf, or Zr, an acidic etchant having selectivity can be used.

For the mask 118, for example, $SiO_2$ or SiN can be used. The formation method is not limited in particular. For example, after depositing $SiO_2$ on the entire surface of the AlN buffer layer 106, the periphery of the semiconductor layers, and the edge of the surface of the support 116 by CVD, a metal mask (for example, Ni) for exposing only the predetermined region 120 is formed and the $SiO_2$ in the predetermined region 120 is etched by RIE. Thus, the state shown in FIG. 2(D) can be obtained.

The anisotropic etching is not limited in particular as long as pyramidal protrusions can be formed on the (000-1) plane side of the III nitride semiconductor layer. For example, it may be wet etching using an alkaline solution such as a 2.38 mass % tetramethylammonium hydroxide (TMAH) solution, a NaOH solution, or a KOH solution. In that case, each protrusion has a hexagonal pyramidal shape, and surfaces of the protrusion (six side surfaces of the hexagonal pyramid) are planar, each of which is principally the (10-1-1) plane. Note that there is also a document (Appl. Phys. Lett., Vol. 73, No. 18, 2 Nov. 1998) stating that when another etchant (phosphoric acid or the like) is used, the (10-1-2) plane and the (10-1-3) plane appear. However, the (10-1-1) plane is more preferable since the angle of each protrusion is large and the valleys are deep.

The treatment conditions of the anisotropic etching are also not limited in particular as long as pyramidal protrusions can be formed on the (000-1) plane side of the III nitride semiconductor layer. In this embodiment, it is required to remove the AlN buffer layer 106 and the superlattice buffer layer 108 and to form protrusions on the n layer 110. Although it also depends on the thickness of the AlN buffer layer 106 and the superlattice buffer layer 108, in the case of using a 2.38 mass % TMAH solution, the treatment time of the anisotropic etching is preferably one minute or more, and is more preferably in the range of five minutes to 60 minutes.

When isotropic etching is performed on a flat surface, etching proceeds at a same rate irrespective of the position in the surface. However, when etching is performed on a surface having pyramidal protrusions in FIG. 3(A) as in this production method, etching is likely to proceed faster at the top of each protrusion where physical suction and separation easily occur, than at the bottom portion thereof. Therefore, in this production method, anisotropic etching followed by isotropic etching allows the projections 122 to change into the protrusions 124 that are rounded at the top.

For the size of the protrusions, the height is 0.1 μm to 3 μm, yet is not necessarily uniform. The protrusions are distributed over the whole region which has been treated by anisotropic etching and isotropic etching; however, there are also regions where the protrusions are not uniformly distributed. The rounding shape is still uniform; accordingly, the rounded protrusions distributed in the whole region treated by anisotropic etching and isotropic etching each have the like dome shape and bottom portions 126 formed between adjacent protrusions 124 each has a steep angle as shown in FIG. 3(B).

The bottom portions 126 of the valleys thus have a steep angle, since anisotropic etching is performed in a first step in a two-step etching. In other words, as compared with cases where the protrusions are formed using a mask pattern or the like, in the present invention, the valley bottom portions formed at a great depth of 3 μm at most by combining anisotropic etching and isotropic etching each form a steep angle formed by anisotropic etching to have a finer and more complicated random surface. Therefore, the area of the random surface in contact with the ohmic electrode is also large, and the ohmic contact properties are significantly improved.

Figure 3C:
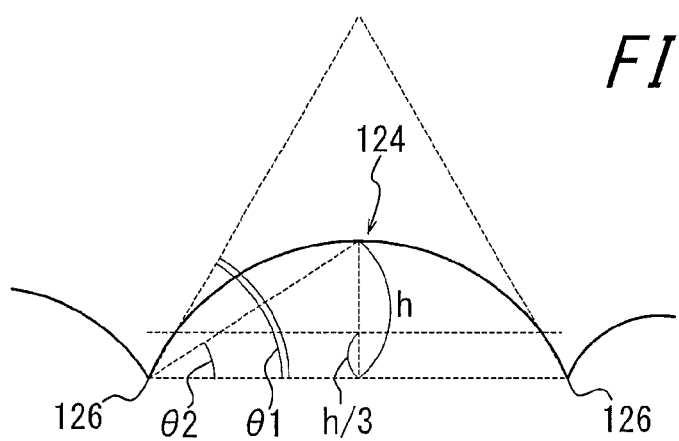
FIG. 3(C) is a schematic view illustrating a method of measuring a protrusion in FIG. 3(B).

The protrusions 124 have the valley bottom portions 126 having a steep angle partly inheriting the regularity of the shape obtained by anisotropic etching. Accordingly, as shown in FIG. 3(C), in a cross section of one of the protrusions 124, a triangle can be drawn to have a line linking two of the valley bottom portions 126 as the base and straight lines connecting intersections between a line drawn parallel to the base at one third of the height (h) from the base to the top of the protrusion (h/3) and the valley bottom portions 126 as sides. Hence, "rounded like (a) dome(s)" herein means that with respect to the height from the base of the circumscribed triangle to the top thereof, the height from the base to the top of the protrusion is low, namely, with respect to an angle θ1 between the base of the circumscribed triangle and the line angled toward the top thereof, an angle θ2 between the base of the triangle and the line angled toward the top of the protrusion is small, and the shape formed from the base to the top of the protrusion is nonlinear. The difference (θ1−θ2) between the above two angles (the mean values) is, for example, 3 degrees to 30 degrees. Note that a cross section of each protrusion preferably has a shape rounded from the base toward the top of the protrusion outward from the protrusion.

For the isotropic etching, for example, dry etching such as reactive ion etching (RIB) can be used. For RIB, when etching a nitride semiconductor, a gas of chlorine, silicon tetrachloride, boron trichloride, or the like can be used.

In view of ensuring the formation of protrusions having a dome shape as described above, although it also depends on the conditions other than the time, the treatment time of the isotropic etching is preferably three minutes or more, more preferably five minutes or more.

For the electrode material of the n-side electrode 128, Al, Cr, Ti, Ni, Pt, Au, or the like is used; however, a Ti/Al electrode is preferably used, since stable ohmic properties can easily be obtained. Such a Ti/Al electrode can be formed, for example by sputtering.

Note that in this embodiment, the first conductivity type is p type, whereas the second conductivity type is n type. A p-type layer has high resistance, which prevents current diffusion, so that the light emission efficiency can easily be increased by providing an n-type layer having lower resistance on the light extraction side.

The method of forming the n-side electrode 128 shown in FIG. 2(G) is not limited in particular, and the n-side electrode 128 can be formed by a lift-off process using resist as a mask. When this lift-off process is used, the method shown in FIGS. 5(A) to 5(E) is preferable in particular. FIGS. 5(A) to 5(F) are cross-sectional views in which an electrode formation area on the n layer 110 is enlarged.

Figure 5A:
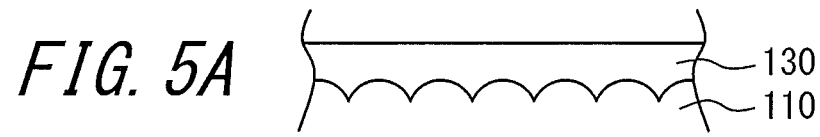
FIGS. 5(A) to 5(F) are schematic cross-sectional views illustrating an example of an electrode formation process.

First, as shown in FIG. 5(A), a protective film 130 is formed at least on the upper surface of the predetermined region 120 of the n layer 110. The protective film 130 is formed by depositing an insulating film of $SiO_2$ or SiN by CVD as with the mask 118.

Figure 5B:
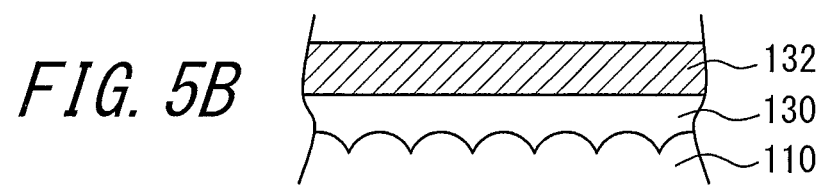
Figure 5C:
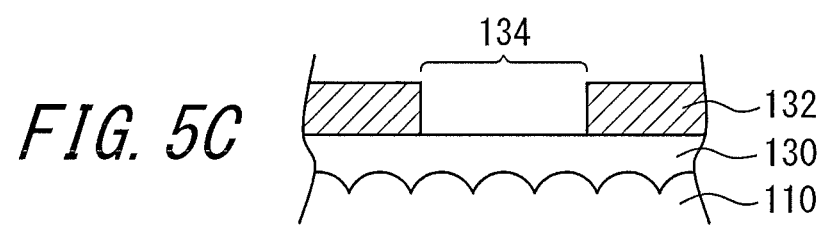

Next, as shown in FIG. 5(B), resist 132 is applied onto the protective film 130 and the resist of the electrode formation area 134 is removed by photolithography as shown in FIG. 5(C). At that point, the surface of the n layer 110 is covered with the protective film 130, so that an alkaline solution used to remove the resist, such as 2.38 mass % TMAH does not meet the n layer 110. Accordingly, the surface condition of the n layer 110, that is, the condition where the surface of each protrusion 124 is a random surface formed by isotropic etching can be preferably maintained.

Figure 5D:
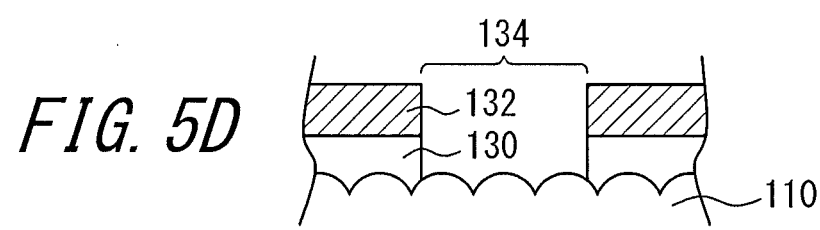

Subsequently, as shown in FIG. 5(D), the protective film 130 of the electrode formation area 134 is removed. The removal can be performed using a given etchant which is capable of etching a protective film of BHF, HF, or the like but does not erode the n layer 110.

Figure 5E:
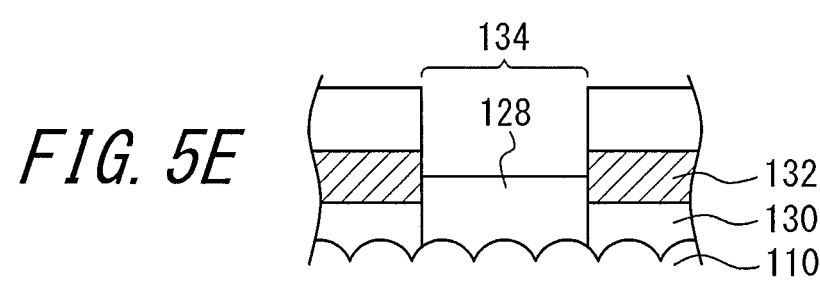
Figure 5F:
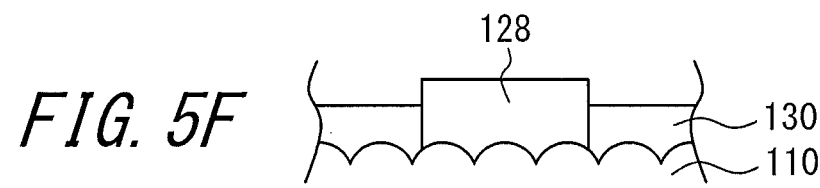

Next, as shown in FIG. 5(E), the n-side electrode 128 such as a Ti/Al electrode is formed in the electrode formation area 134 by sputtering. Note that the electrode material deposited on the resist 132 can be removed while removing the resist 132 using acetone or the like as shown in FIG. 5(F).

Finally, in order to form a good ohmic contact between the n layer and the n-side electrode, annealing is performed at a temperature of approximately 400° C. to 600° C. in a vacuum.

The above shows examples of typical embodiments, and the present invention is not limited to those embodiments. The invention can be modified as appropriate without departing from the scope of the claims.

EXAMPLES

Example 1

A III nitride semiconductor LED device shown in FIG. 1 was fabricated by the method shown in FIGS. 2(A) to 2(G) and FIGS. 3(A) to 3(C). Specifically, first, an AlN single crystal layer (thickness: 1 μm) was fabricated on a sapphire growth substrate by MOCVD to form an AlN (0001) template. On this growth substrate, Sc was deposited (thickness: 8 nm) by sputtering, and the deposited Sc was then nitrided in an MOCVD apparatus, thereby forming a ScN layer as a lift-off layer.

After that, an AlN layer (thickness: 1 μm), a superlattice buffer layer (AlN/GaN laminate, thickness: 1 μm), an n-type III nitride semiconductor layer ($Al_{0.3}Ga_{0.7}N$ layer, thickness: 2 μm), a light emitting layer (AlInGaN-based MQW layer, thickness: 0.2 μm), a p-type III nitride semiconductor layer ($Al_{0.3}Ga_{0.7}N$ layer, thickness: 0.4 μm), and a p-type GaN contact layer (thickness: 0.05 μm) were sequentially stacked as semiconductor layers on the lift-off layer.

The semiconductor layers were then partially removed by RIE to partially expose the sapphire substrate to form grooves in a grid pattern, thereby forming a plurality of separate semiconductor structures each having a square transverse cross section.

A p-type ohmic electrode (Ni/Au, thickness: 200/3000 angstroms) was formed on the p-type contact layer. On the p-type ohmic electrode, a junction layer (Ti/Pt/Au, thickness: 100/2000/7000 angstroms) was formed. After that, a Si substrate of a support provided with Ti/Pt/Au/Sn/Au having a thickness of: 100/2000/1000/2000/7000 angstroms as a junction layer is bonded to the semiconductor structures by joining the junction layers of the substrate and the semiconductor structures by thermocompression bonding.

After that, the sapphire growth substrate was separated by chemical lift-off. A diammonium cerium(IV) nitrate liquid solution selective for the ScN layer was used as the etchant.

Next, $SiO_2$ (thickness: 3 μm) was deposited on the entire surface of the AlN buffer layer, the periphery of the semiconductor layers, and the edge of the surface of the support by plasma-enhanced CVD, and a Ni mask was then formed by sputtering. The Ni mask was formed by forming a resist pattern by photolithography and removing only portions of the Ni film where the n layer was to be exposed, by wet etching. After that, the $SiO_2$ exposed by RIE was removed by etching.

Next, the process of forming the surface of the n layer is described. Etching was performed using the formed $SiO_2$ as a mask under the conditions shown in Table 1 to remove the AlN buffer layer and the superlattice buffer layer and also expose the surface of the n layer. In the anisotropic etching in Table 1, a 2.38 mass % TMAH solution was used. Further, the isotropic etching in Table 1 was RIE under the specific conditions of pressure: 0.1 Pa, output of ICP and BIAS: 400 W, a $Cl_2$ gas: 7.5 sccm, and a $BCl_3$ gas: 7.5 sccm. As described in Table 1, in Example 1, anisotropic etching was performed at 40° C. for ten minutes, and RIE was then performed for 20 minutes. After that, cleaning was performed using purified water. Note that the above described etching was performed on the side where the growth substrate was separated, and the n layer is exposed on the (000-1) plane side of the n layer.

Subsequently, a Ti/Al electrode was formed on the n layer exposed by the following method. First, $SiO_2$ (thickness: 0.1 μm) was deposited on the exposed n layer by plasma-enhanced CVD. Photoresist was then applied onto the $SiO_2$ and the resist of the electrode formation area was removed by photolithography. The resist was removed using a 2.38 mass % TMAH solution. Subsequently, the $SiO_2$ in the electrode formation area was removed by a one minute treatment using a BHF solution. After that, an electrode of Ti/Al (thickness: 20 nm/600 nm) was formed by sputtering. The photoresist and Ti/Al deposited thereon were removed with acetone. Finally, annealing was performed at 400° C. in a vacuum. In Example 1, since $SiO_2$ serves as a protective film, anisotropic etching is not performed on the n layer with a TMAH solution when removing the resist.

Examples 2 to 7 and Comparative Examples 1 to 4

III nitride semiconductor LED devices were fabricated in the same manner as in Example 1 except that the process of forming the surface of the n layer was as described in Table 1.

Comparative Example 5

A III nitride semiconductor LED device was fabricated in the same manner as in Example 1 except that the process of forming the surface of the n layer, described in Table 1 was used and the formation and removal of $SiO_2$ were not performed in the formation of the Ti/Al electrode. In that case, in removing the resist in the electrode formation area, the 2.38 mass % TMAH solution meets the n layer; accordingly, another anisotropic etching step is performed on the surface of the n layer of the electrode formation area after the process of forming the n layer.

TABLE 1

| | Process of forming n layer surface | | | Anisotropic | Voltage between two point on the |
| --- | --- | --- | --- | --- | --- |
| | Isotropic etching (RIE) | Anisotropic etching (2.38 mass % TMAH solution) | Isotropic etching (RIE) | etching on n layer surface in forming n-side electrodes | n-side electrodes (V) |
| Example 1 | — | 40° C., 10 min | 20 min | Not performed | 1.01 |
| Example 2 | 2 min | 40° C., 20 min | 15 min | Not performed | 1.15 |
| Example 3 | 2 min | 40° C., 20 min | 18 min | Not performed | 1.16 |
| Example 4 | 2 min | 40° C., 20 min | 13 min | Not performed | 1.19 |
| Example 5 | — | 22° C., 5 min | 25 min | Not performed | 1.33 |
| Example 6 | — | 40° C., 10 min | 5 min | Not performed | 1.57 |
| Example 7 | 12 min | 40° C., 30 min | 1 min | Not performed | 1.67 |
| Comparative Example 1 | — | 40° C., 45 min | — | Not performed | 2.08 |
| Comparative Example 2 | 12 min | 40° C., 30 min | — | Not performed | 3.59 |
| Comparative Example 3 | 2 min | 40° C., 50 min | — | Not performed | 3.88 |
| Comparative Example 4 | — | — | 27 min | Not performed | 2.52 |
| Comparative Example 5 | — | 22° C., 5 min | 25 min | Performed | 2.42 |

<Observation with SEM>

In each experimental example, after the process of forming the surface of the n layer before forming the n-side electrode, the surface of the n layer was observed at an oblique viewing angle with a scanning electron microscope (SEM). Further, after the formation and subsequent heat treatment of the n-side electrode, the vicinity of the surface where the n-side electrode was formed was microphotographed. FIGS. 6 to 10 show respective representative SEM images of Example 1, Comparative Example 3, Comparative Example 4, Example 6, and Example 7. Figures (A) are images taken at an oblique viewing angle prior to the formation of the n-side electrode, whereas figures(B) each show an image of a cross section after the formation and heat treatment of the n-side electrode. FIG. 11 shows an image taken at an oblique viewing angle prior to the formation of the n-side electrode of Comparative Example 5.

Figure 6A:
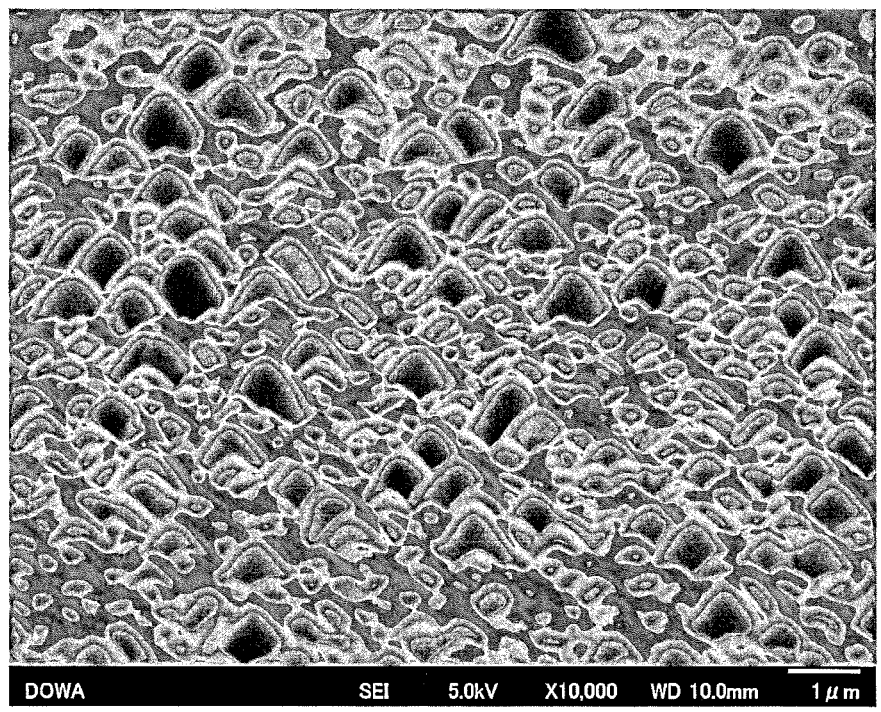
FIGS. 6(A) and 6(B) are SEM images of Example 1.
Figure 6B:
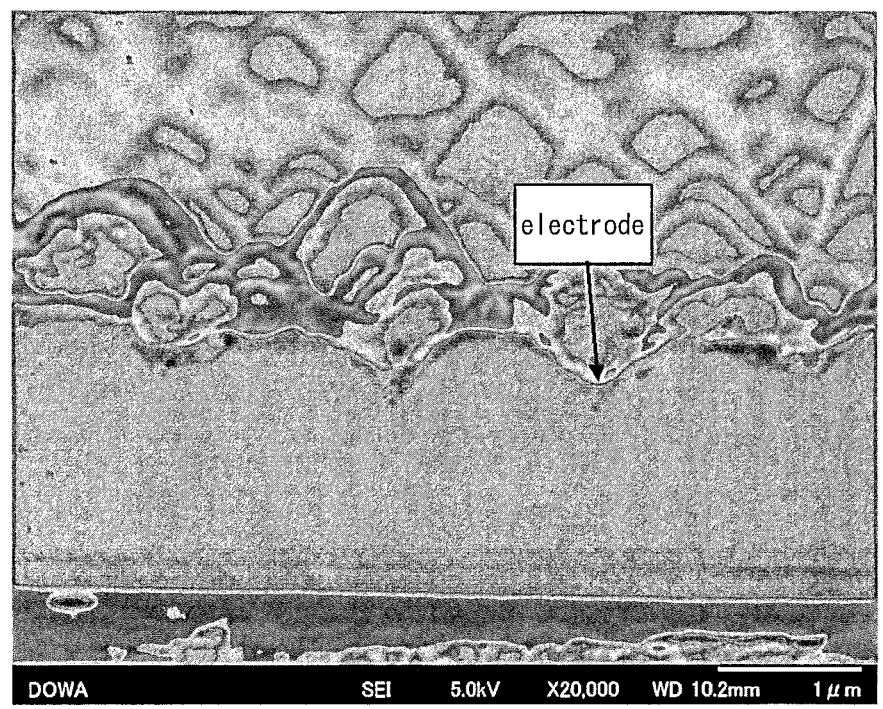

In Example 1, as shown in FIGS. 6(A) and 6(B), a plurality of protrusions rounded like domes were observed on the surface of the n layer. Further, as is apparent from FIG. 6(B), the bottom portions of valleys formed between adjacent protrusions had a steep angle. In order to measure the roundness, the triangles described in FIG. 3(C) were drawn for the protrusions. For each of total ten of the protrusions, the angle θ1 between the triangle base and the line angled toward the top of the triangle and the angle θ2 between the triangle base and a straight line drawn toward the top of the protrusion were measured to find the mean value. In Example 1, θ1 was 62 degrees, whereas θ2 was 51 degrees. In Example 6, θ1 was 64 degrees, whereas θ2 was 50 degrees. Examples 2 to 5 and 7 showed almost the same level of degrees. θ1 was approximately 60 degrees, whereas θ2 was approximately 50 degrees.

Figure 10A:
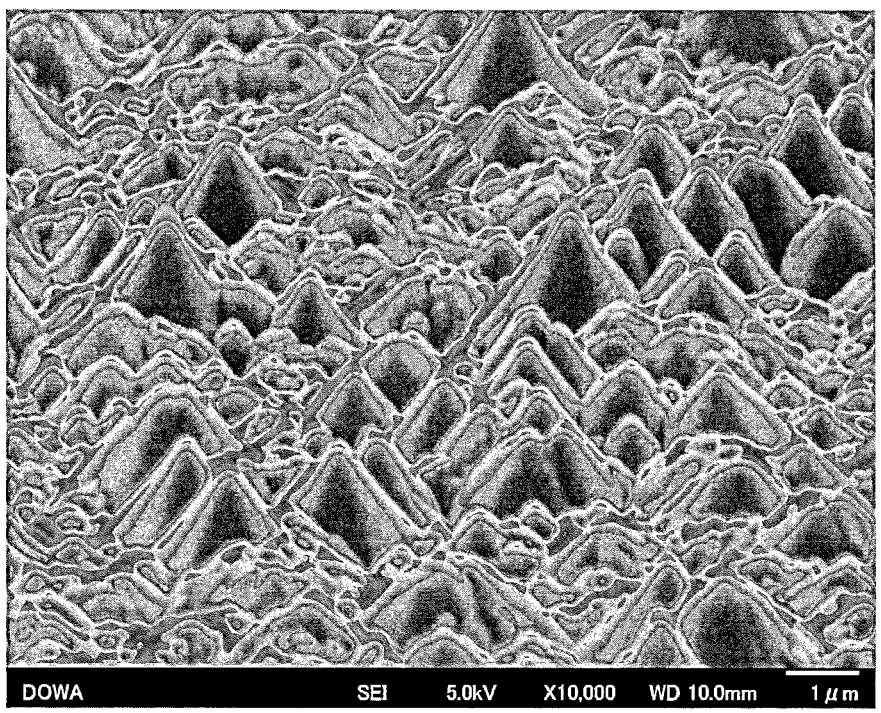
FIGS. 10(A) and 10(B) are SEM images of Example 7.
Figure 10B:
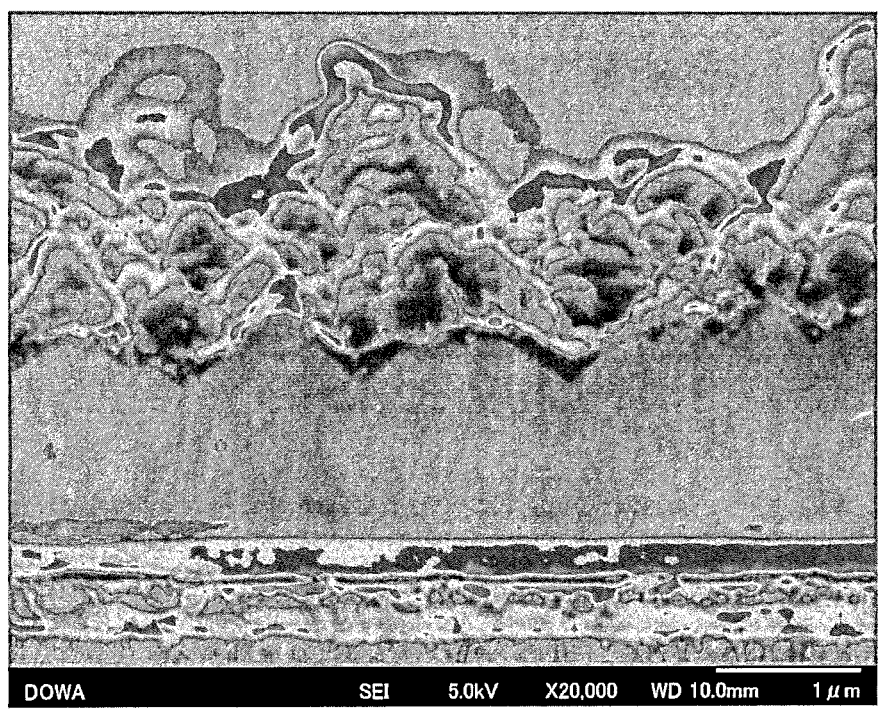
Figure 11:
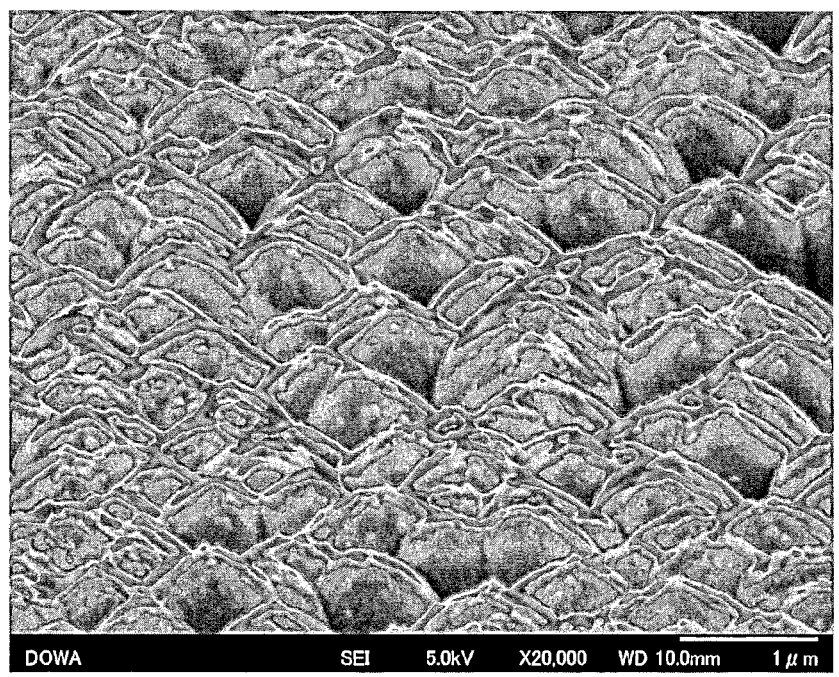
FIG. 11 is a SEM image of Comparative Example 5, showing a surface of an n-type III nitride layer taken at an oblique viewing angle prior to the formation of an n-side electrode.

Further, in Example 7 where the treatment time of isotropic etching was one minute, as shown in FIGS. 10(A) and 10(B), protrusions rounded like domes and protrusions still having a triangular cross-sectional shape (relatively large protrusions in FIG. 10(A), the ratio of which is about 1/3) were mixed. Although the change in shape was insufficient when the treatment time was one minute, the protrusions rounded like domes were formed. Thus, it is evident from the comparison with Comparative Example 2 that the voltage reduction effect was obtained. On the other hand, in Examples 1 to 6 where the treatment time of isotropic etching was five minutes or more, almost all the protrusions were rounded like domes. Moreover, the surface of each protrusion rounded like domes in Examples 1 to 7 is believed not to be a polar surface or a semipolar surface, reported in the cases of anisotropic etching. The surface was obviously a random surface in which a facet was not defined.

Figure 7A:
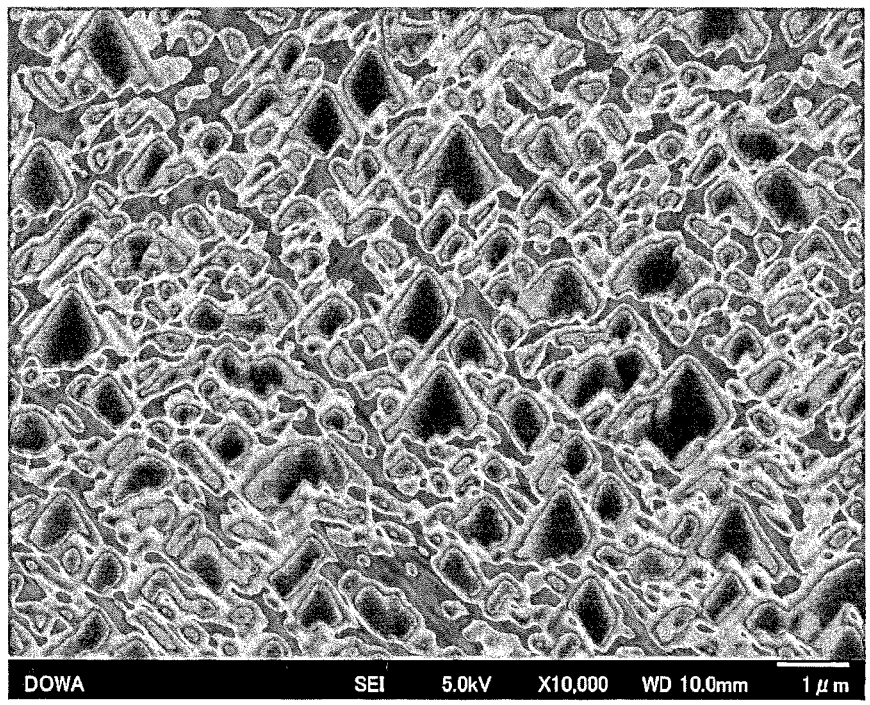
FIGS. 7(A) and 7(B) are SEM images of Comparative Example 3.
Figure 7B:
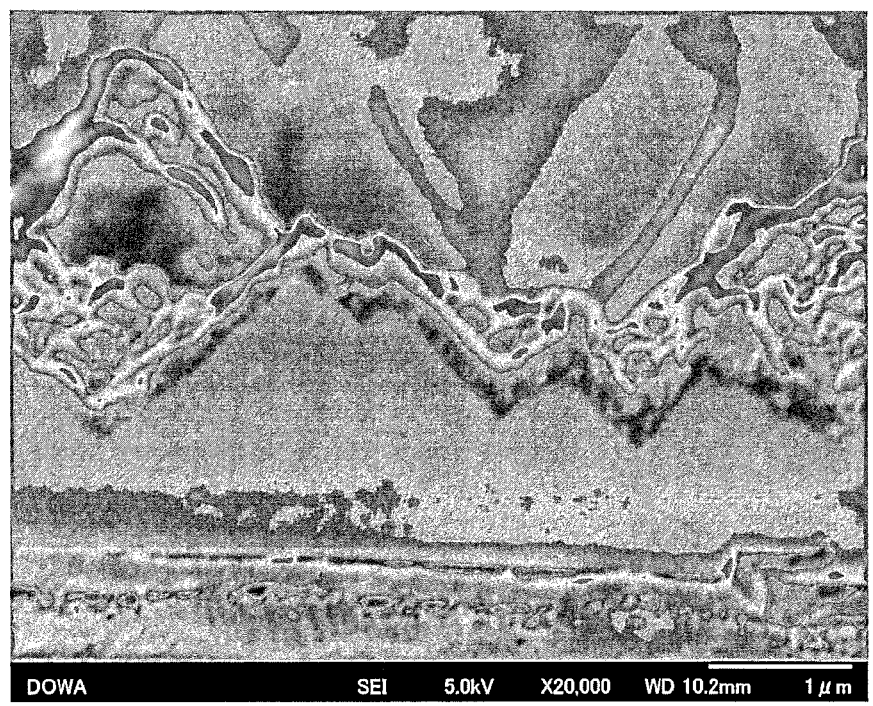

In Comparative Example 3, isotropic etching was not performed after anisotropic etching; accordingly, as shown in FIGS. 7(A) and 7(B), a plurality of hexagonal pyramidal projections were formed on the surface of the n layer. There have been reports saying that the (10-1-1) plane is exposed due to wet etching, so that it can be assumed from FIG. 7 that the side of a projection was angled at 60 degrees against the base and the surface of the projection was the (10-1-1) plane. The same applies to Comparative Examples 1 and 2.

Figure 8A:
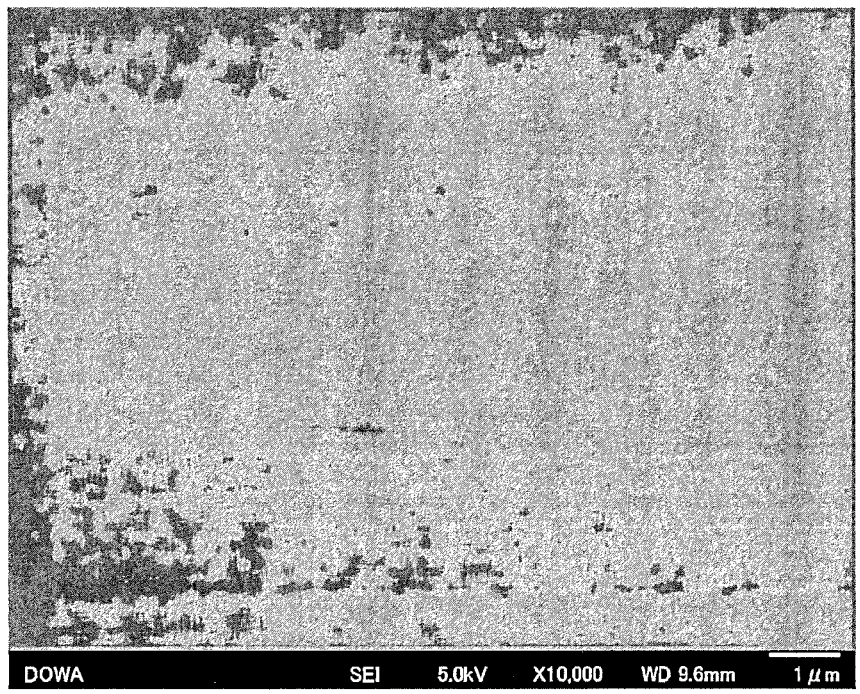
FIGS. 8(A) and 8(B) are SEM images of Comparative Example 4.
Figure 8B:
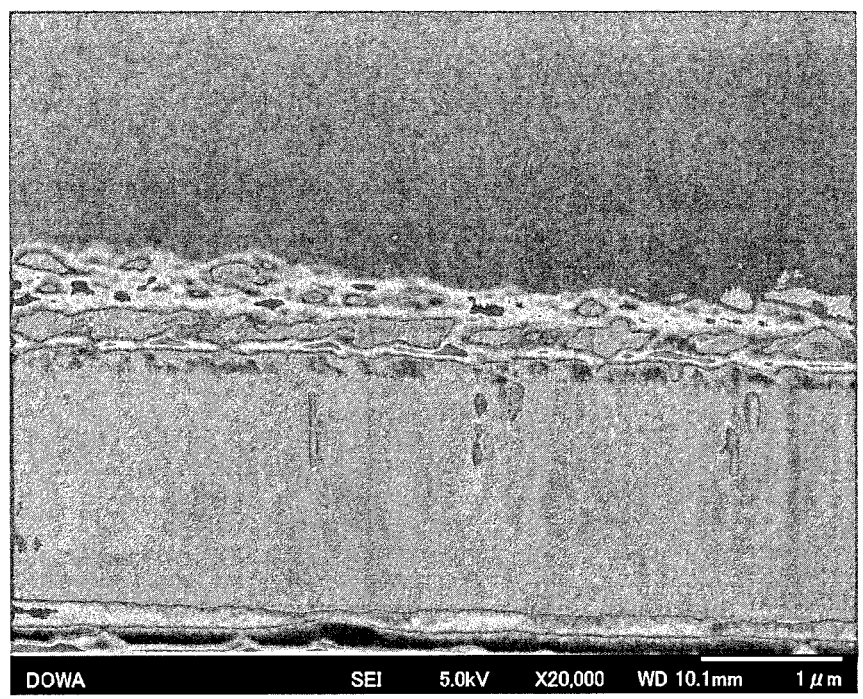
Figure 9A:
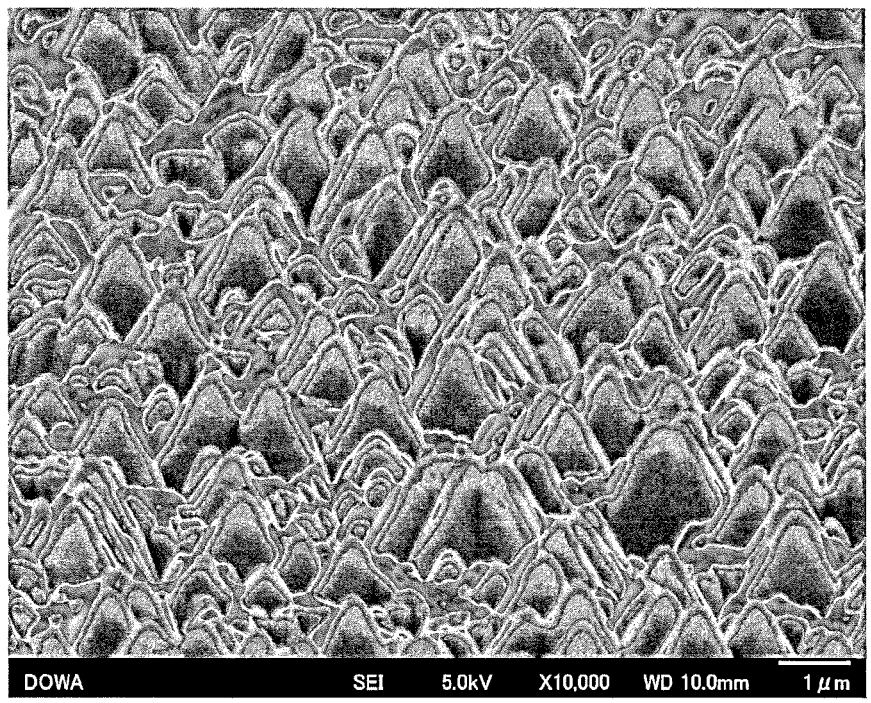
FIGS. 9(A) and 9(B) are SEM images of Example 6.
Figure 9B:
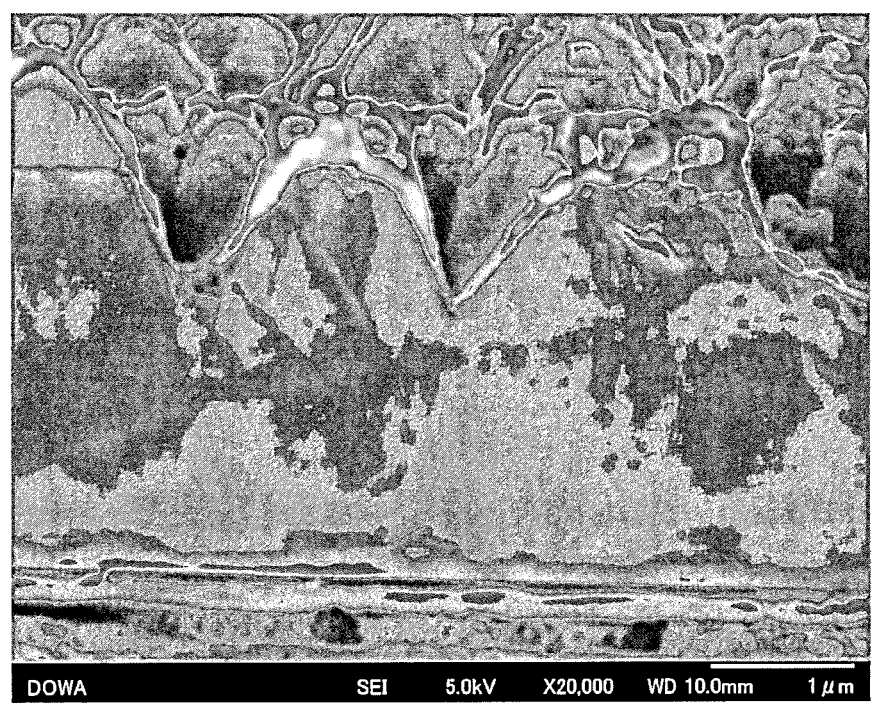

In Comparative Example 4, only isotropic etching was performed, so that the surface of the n layer was flat and the (000-1) plane was exposed as shown in FIGS. 8(A) and 8(B).

Note that in Comparative Example 5, after the process of forming the n layer, when removing the resist of the area where the Ti/Al electrode was to be formed, by photolithography, the electrode formation area of the surface of the n layer meets the 2.38 mass % TMAH solution, thereby performing anisotropic etching. As a result, as shown in FIG. 11, more minute projections were formed on top of the protrusions on the surface of the n layer after removing the resist of the electrode formation area, so that the protrusions were not rounded like domes any more. The minute protrusions seems to have been generated because for the random surface exposed by isotropic etching, portions having weak bond between atoms, which portions are easily etched with an anisotropic etching solution, were etched preferentially. The time required for removing the resist of the electrode formation area (anisotropic etching period) was short as 90 seconds; however, as compared with Example 5, the voltage between two points on the n-side electrodes was higher, which shows that the random surface having the contact resistance reduction effect was changed by anisotropic etching and a face formed mainly by anisotropic etching was formed on the surface again.

<Measurement of Voltage Between Two Points on the n-Side Electrodes>

Square electrodes having a side of 100 μm were placed at 50 μm intervals. The voltage was measured when a 20 mA current was flown between the electrodes. The results are shown in Table 1.

In each example, the voltage between the n-side electrodes was significantly reduced as compared with Comparative Examples. In particular, in Examples 1 to 6 where almost all the protrusions were rounded like domes, the voltage was reduced more than in Example 7.

INDUSTRIAL APPLICABILITY

According to the present invention, a III nitride semiconductor device which can be operated at a lower voltage can be provided, in which device a good ohmic contact is achieved between the (000-1) plane side of the III nitride semiconductor layer and the electrode and a method of producing the III nitride semiconductor device can be provided.

REFERENCE SIGNS LIST

100: III nitride semiconductor device
102: Growth substrate
104: Lift-off layer
106: AlN buffer layer
108: Superlattice buffer layer
110: N-type (second conductivity type) III nitride semiconductor layer
112: Active layer
114: P-type (first conductivity type) III nitride semiconductor layer
116: Support (p-side electrode)
118: Mask
120: Predetermined region
122: Pyramidal projections
124: Protrusions
126: Valley bottom portions
128: N-side electrode
130: Protective film
132: Resist
134: Electrode formation area

The invention claimed is:

1. A III nitride semiconductor device having a III nitride semiconductor layer, comprising:
   a plurality of protrusions rounded like domes in a predetermined region on the (000-1) side of the III nitride semiconductor layer, a surface of the plurality of protrusions comprising planes except for the (000-1) plane, and a height of the protrusions being 0.1 μm to 3 μm; and
   an electrode on the upper surface of the predetermined region.

2. The III nitride semiconductor device according to claim 1, wherein the bottom portions of valleys formed between the adjacent protrusions has a steep angle.

3. The III nitride semiconductor device according to claim 1, wherein the surface of each of the protrusions is a random surface in which a facet cannot be defined.

4. A III nitride semiconductor device comprising:
a support;
and a first conductivity-type III nitride semiconductor layer, an active layer, and a second conductivity-type III nitride semiconductor layer sequentially placed on the support,
wherein the side of the second conductivity-type III nitride semiconductor layer opposite to the support is the (000-1) side, and
the III nitride semiconductor device has a plurality of protrusions rounded like domes in a predetermined region on the (000-1) side of the second conductivity-type III nitride semiconductor layer and has an electrode on the upper surface of the predetermined region, a surface of the plurality of protrusions comprising planes except for the (000-1) plane, and a height of the protrusions being 0.1 µm to 3 µm.

5. The III nitride semiconductor device according to claim 4, wherein the second conductivity type is n type.

6. The III nitride semiconductor device according to claim 4, wherein the electrode is a Ti/Al electrode.

7. A method of producing a III nitride semiconductor device having a III nitride semiconductor layer, comprising the steps of:
performing anisotropic etching on a predetermined region on the (000-1) side of the III nitride semiconductor layer to form a plurality of pyramidal projections;
performing isotropic etching on the predetermined region to change the projections into protrusions rounded like domes, a surface of the protrusions comprising planes except for the (000-1) plane; and
forming an electrode on the upper surface of the predetermined region having the protrusions.

8. The method of producing a III nitride semiconductor device, according to claim 7, wherein the anisotropic etching is wet etching in which the surface of each of the projections is a facet other than the (000-1) plane.

9. The method of producing a III nitride semiconductor device, according to claim 8, wherein the facet is one of the (10-1-1) plane, the (10-1-2) plane, and the (10-1-3) plane.

10. The method of producing a III nitride semiconductor device, according to claim 8, wherein an alkaline solution is used in the anisotropic etching.

11. The method of producing a III nitride semiconductor device, according to claim 8, wherein the isotropic etching is dry etching in which the surface of each of the protrusions is a random surface where a facet cannot be defined.

12. The method of producing a III nitride semiconductor device, according to claim 7, wherein the step of forming the electrode comprises:
forming a protective film on the upper surface of the predetermined region;
applying resist onto the protective film and removing the resist of an electrode formation area by photolithography;
removing the protective film of the electrode formation area; and
forming an electrode in the electrode formation area.

13. The method of producing a III nitride semiconductor device, according to claim 7, wherein the height of the protrusions is 0.1 µm to 3 µm.

14. A method of producing a III nitride semiconductor device, comprising the steps of:
forming a lift-off layer, a second conductivity-type III nitride semiconductor layer, an active layer, and a first conductivity-type III nitride semiconductor layer in this order on a growth substrate;
forming a support on the first conductivity-type III nitride semiconductor layer;
removing the lift-off layer, thereby separating the growth substrate from the second conductivity-type III nitride semiconductor layer;
performing anisotropic etching on a predetermined region of the exposed second conductivity-type III nitride semiconductor layer on the (000-1) plane side, thereby forming a plurality of pyramidal projections;
performing isotropic etching on the predetermined region and changing the projections into a plurality of protrusions rounded like domes, a surface of the plurality of protrusions comprising planes except for the (000-1) plane; and
forming an electrode on the upper surface of the predetermined region having the protrusions.

15. The method of producing a III nitride semiconductor device, according to claim 14, wherein the height of the protrusions is 0.1 µm to 3 µm.

* * * * *